United States Patent [19]
Moore, Jr.

[11] Patent Number: 5,142,443
[45] Date of Patent: Aug. 25, 1992

[54] CRYOGENIC COOLING OF CIRCUIT BOARDS

[75] Inventor: Raymond W. Moore, Jr., Pocasset

[73] Assignee: Koch Process Systems, Inc., Worcester, Mass.

[21] Appl. No.: 692,608

[22] Filed: Apr. 29, 1991

[51] Int. Cl.⁵ .............................................. H05K 7/20
[52] U.S. Cl. .................... 361/385; 174/15.4; 357/81; 357/82; 357/83; 361/386; 361/388
[58] Field of Search .................... 174/15.4; 357/81, 82, 357/83; 361/382, 385, 386, 388, 389

[56] References Cited

U.S. PATENT DOCUMENTS

| | | | |
|---|---|---|---|
| 4,531,146 | 7/1985 | Cutchaw | 361/385 |
| 4,879,629 | 11/1989 | Tustaniwskyj et al. | 361/385 |
| 4,879,632 | 11/1989 | Yamamoto et al. | 361/382 |

OTHER PUBLICATIONS

Chu et al., "Conduction Cooling for an LSI Package: A One-Dimensional Approach", Jan. 1982, pp. 45-54.
Oktay, S., et al., "High Heat From a Small Package", *Mechanical Engineering*, Mar. 1986, vol. 108 No. 3, pp. 36-42.

*Primary Examiner*—Gregory D. Thompson
*Attorney, Agent, or Firm*—Shook, Hardy & Bacon

[57] ABSTRACT

A mounting arrangement for electronic circuit chips in which at least one chip is mounted upon an appropriately electrically insulating chip plate. A connector board is mounted on top of the chip plate to electrically connect the chip with a cable allowing signals to be passed to and from the chip. The chip plate is mounted for good thermal conductivity to a refrigerator cold head. A plate formed of a material with good heat conductivity properties may be interposed between the chip plate and the cold head. This plate may include an element, such as a spring biased piston, which contacts the chip to allow heat transfer by conduction. The refrigerator cold head forms the upper surface of the expansion space in a Stirling-cycle cryogenic cooling engine. To reduce power requirements, the elements are insulated from contact with the atmosphere. Specifically, the elements are enclosed in a vessel which includes a double walled hood having insulating material and a high vacuum between the double walls to reduce heat transfer. Additionally, bulk insulation may be placed around the refrigerator cold head and aluminum plate within the confines of the hood. Finally, sealing means are provided at the bottom of the hood to seal the interior of the vessel, thus further reducing heat transfer.

20 Claims, 1 Drawing Sheet

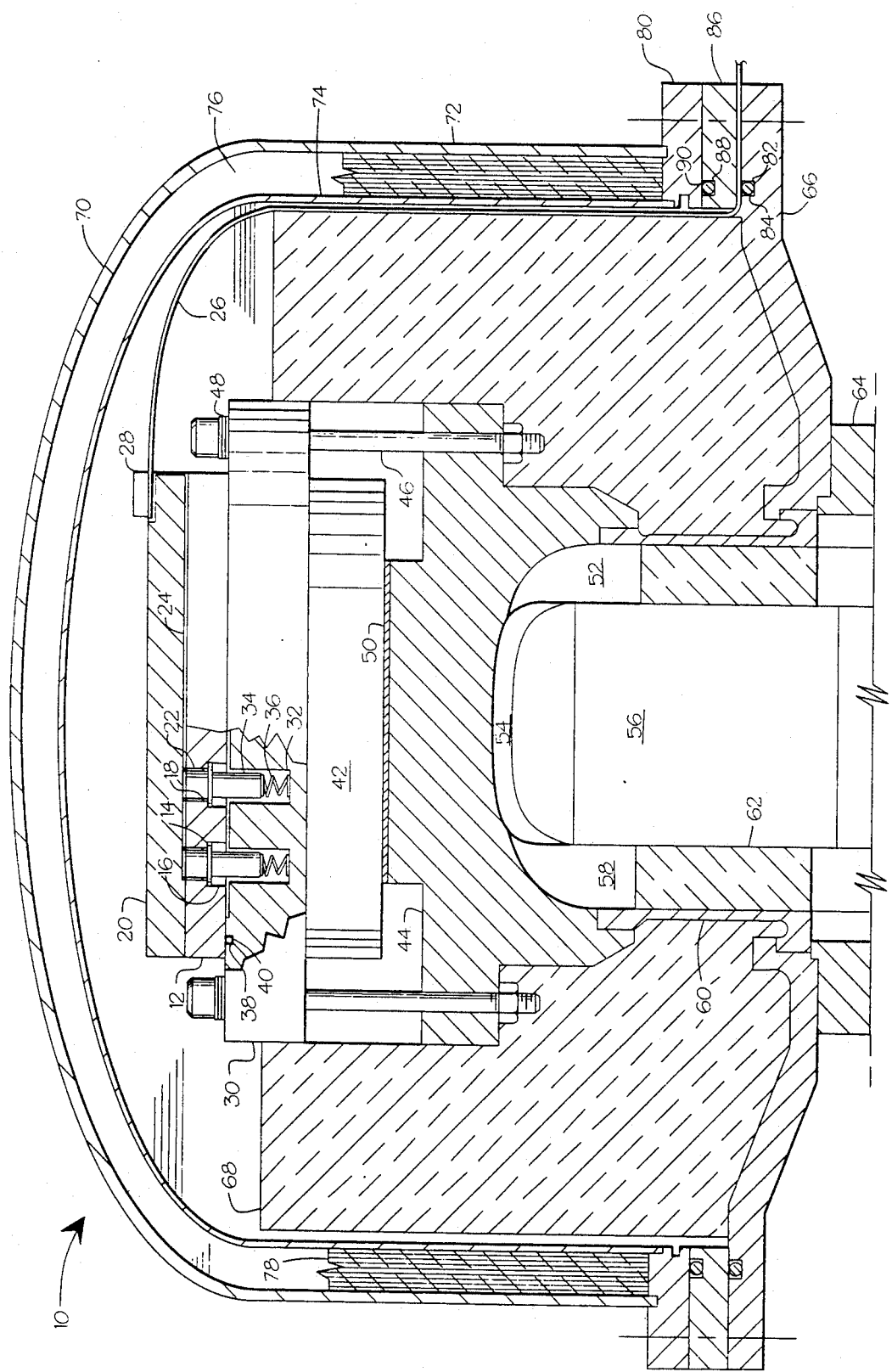

CRYOGENIC COOLING OF CIRCUIT BOARDS

BACKGROUND OF THE INVENTION

1. Field of the Invention

The present invention relates in general to the mounting of electronic circuit components. In particular, the present invention relates to an improved mounting for integrated circuits which allows cryogenic cooling of such circuits.

2. Description of the Related Art

Numerous types of mountings for integrated circuits are known. Many of these mountings allow for dissipation of the heat generated by these electric circuits. For example, it is known to provide heat radiating fins upon the integrated circuit packages themselves or upon the module which houses these integrated circuits.

It is also known to provide refrigeration plates having a cooling fluid circulating therethrough in the mounting for the integrated circuits. One example of this is the IBM ®3081 thermal conduction module (TCM). In this arrangement a large number of integrated circuit chips are mounted in an array on a ceramic substrate. An aluminum block is mounted over this substrate with a cavity above each of the chips. Within the cavities are aluminum pistons which are spring loaded to maintain contact with the upper surface of the chips. Within each of these cavities a helium atmosphere is maintained, with appropriate sealing provided at the periphery of the module between the ceramic substrate and aluminum piston plate. Above the aluminum piston plate a cold plate is mounted which includes appropriate ducting to allow the circulation of cold water therethrough. With this arrangement the heat generated by the chips is readily transferred through the aluminum and helium to be transferred to the cold water circulating through the cold plate.

This arrangement, and others like it, provide good cooling of integrated circuit mountings. However, it is also known that the cooling of integrated circuits to cryogenic levels increases their operating speed dramatically, often by a factor of 2. Despite the clear advantages of cryogenic cooling of integrated circuits, the use of such cooling has not been widespread. This is due to the difficulties in maintaining the integrated circuits at the extremely low cryogenic temperatures.

SUMMARY OF THE INVENTION

An object of the present invention is to provide a mounting arrangement for integrated circuit chips which provides good thermal conductivity for increased heat dissipation.

Another object of the present invention is to provide a mounting for integrated circuits which allows relatively simple and inexpensive cryogenic cooling of the circuits.

A further object of the present invention is to provide a cryogenic mounting for integrated circuits which allows easy access to the integrated circuit chips.

These and other objects are achieved by a mounting arrangement for electronic circuit chips in which at least one chip is mounted upon an appropriately electrically insulating chip plate. A connector board is mounted on top of the chip plate to electrically connect the at least one chip with a cable allowing signals to be passed to and from the chip or chips. The chip plate is mounted for good thermal conductivity to a refrigerator cold head. A plate formed of a material with good heat conductivity properties, such as aluminum, may be interposed between the chip plate and the refrigerator cold head. This aluminum plate may include an element, such as a spring biased piston, which contacts the chip to allow heat transfer away from the chip by conduction. Additionally, the chip plate may be sealed to the aluminum plate such that an atmosphere other than air is present adjacent the chips to increase the heat transfer by convection.

The refrigerator cold head forms the upper surface of the expansion space in a Stirling-cycle cryogenic cooling engine. As such, this expansion space forms a cryogenic heat sink just below the refrigerator cold head.

To reduce power requirements, all of the previously recited elements are insulated from contact with the atmosphere. Specifically, the elements are enclosed in a vessel which includes a double walled hood having insulating material and a high vacuum between the double walls to reduce heat transfer. Additionally, bulk insulation may be placed around the refrigerator cold head and aluminum plate within the confines of the hood. Finally, sealing means are provided at the bottom of the hood to seal the interior of the vessel, thus further reducing heat transfer.

BRIEF DESCRIPTION OF THE DRAWINGS

The objects and features of the invention noted above are explained in more detail with reference to the drawing in which like reference numerals denote like elements, and which is a cross sectional view of the cryogenic cooling vessel according to the present invention.

DETAILED DESCRIPTION OF THE INVENTION

With reference to the figure, reference numeral 10 generally designates the cryogenic circuit cooling device of the present invention. The device 10 includes a chip support plate 12 which is generally planar in configuration. Support plate 12 is adapted to mount at least one integrated circuit chip 14 thereon. Preferably, support plate 12 mounts a number of chips 14, possibly arranged in an array. The support plate 12 may include appropriate depressions 16 which receive the integrated circuit chips 14. The chips 14 may be held within the depression by solder bumps, adhesives or other means to prevent their displacement from the respective depressions 16.

Support plate 12 is typically formed of ceramic or other dielectric material. The exterior configuration of support plate 12 may take any form, and typically is dependent upon the shape of the array of depressions 16 and chips 14. Support plate 12 additionally includes means permitting electrical connection with the chips 14. This would typically take the form of pin holes 18 plated on their interior with an electrically conductive material.

It is readily apparent that further means allowing electrical communication with the chips 14 is necessary to access the capabilities of the chips. Where the support plate 12 is provided with an array of chips and conductive pin holes 18, this further means may conveniently take the form of a connector board 20 mounted to support plate 12. Connector board 20 is advantageously formed of fiber glass and may be of the standard G10 specification.

Connector board 20 will include a plurality of pins 22 arranged to mate with conductive pin holes 18, with the pins 22 communicating with appropriate respective electrically conductive plating on the connector board 20. This plating 24 may advantageously extend about one edge of connector board 20 for appropriate electrical connection with a ribbon cable 26. Such an electrical connection may be secured by an appropriate cable clamp 28 formed of dielectric material. Cable clamp 28 may be secured to the connector board 20 by screws, clips or other appropriate means. The connection of the ribbon cable to the connector board on the upper surface of the connector board reduces the amount of time required to service the device 10.

The chip support plate 12 is mounted upon a piston plate 30. Piston plate 30 is preferably formed of a material having good thermal conductivity properties, and is typically formed of aluminum. Chip support plate 12 may be secured to piston plate 30 by screws or other appropriate means.

To improve the thermal conductivity between the chips 14 and piston plate 30, means may be provided to allow thermal conduction between these two elements. For example, the piston plate 30 may include a plurality of piston cavities 32 arranged in an array corresponding to the array of chips 14. Mounted within each of the piston cavities 32 is a piston 34 biased into contact with the chip 14 by a spring 36. To improve the thermal conduction, the piston 34 and spring 36 may be formed of aluminum.

To reduce the thermal resistance between the chips 14 and piston plate 30 the piston cavities 32 and depressions 16 may be charged with an appropriate gas. For example, the cavities 32 and 14 may be charged with helium. In such a case the chip support plate 12 must be hermetically sealed to the piston plate 30 to prevent escape of the gas. To this end, the piston plate 30 (or chip support plate 12) may include a peripheral seal groove 38 extending about the periphery of the array of depression 16. Mounted within seal groove 38 will be a seal 40 to prevent escape of the gas.

It should be noted that the cavities 32 and 16 may have sufficiently low thermal resistance with standard atmospheric air filling the cavities. In such a case the seal groove 38 and seal 40 are not required.

The piston plate 30 may be mounted upon a cooling plate 42. As with the piston plate, cooling plate 42 should have good thermal conductivity properties and may advantageously be formed of aluminum or copper. The cooling plate 42 is, in turn, supported by a refrigerator cold head 44. The piston plate 30, cooling plate 42 and cold head 44 may be secured together by appropriate bolts 46 extending through the piston plate 30 and cold head 44. To ensure adequate pressure to maintain a large microscopic contact area, and thus improve thermal conductivity, springs 48 may be mounted between the heads of bolts 46 and the piston plate 30.

The thermal conductivity between the cold head 44 and chips 14 may be further increased by placing a material having a low modulus of elasticity (i.e., a "soft" material) and having a high coefficient of thermal conductivity between the various contact surfaces of the device. This will have the effect of increasing the microscopic contact area between the various elements while not significantly reducing the thermal conductivity. For example, an indium shim 50 in the form of a foil or slightly greater thickness may be placed between cold head 44 and cooling plate 42. It should be noted that materials other than indium may be used, and that similar shims may be placed between the piston plate 30 and cooling plate 42, between piston plate 30 and spring 32, between spring 32 and piston 34 and finally, between piston 34 and chip 14. The springs 48 assure that good surface contact is maintained between the surfaces of shim 50, plate 30 and cold head 44 by maintaining pressure on these elements as noted above. The relatively soft material of which shim 50 is constructed can fill irregularities in the surfaces of the plate 30 and cold head 44 and thereby enhance the thermal conductivity.

It should also be noted that certain elements between the cold head 44 and chips 14 may be eliminated. For example, aluminum piston plate 30 may rest directly upon cold head 44, or may rest upon an appropriate indium shim which, in turn, rests upon cold head 44. However, it may be advantageous to retain the described elements to provide the array of chips 14 with a heat sink of sufficient size and relatively equal temperature.

To attain the desired temperatures of the chips 14, the cold head 44 is in thermal communication with an appropriate cryogenic heat sink means. While various devices may fill this requirement, it is preferred that the cold head 44 communicate with a Stirling-cycle cryogenic cooling engine. Additionally, it has been found very advantageous to form the lower portion of cold head 44 as an integral part of this Stirling-cycle engine.

Specifically, the lower portion of cold head 44 may define a cold head cavity 52 within which portions of the cooling engine are located. For example, a portion of the cold head cavity 52 may form an expansion space 54 above a typical displace 56. An annular portion of the cold head cavity 52 about the displacer 56 may function as a heat exchanger 58.

To reduce the thermal transfer from the cooling engine the cold head 44 may include an engine ring 60 extending downwardly from, and forming a continuation of, the cold head cavity 52. To provide appropriate thermal resistance and strength, engine ring 60 may be formed of stainless steel. Various other portions of the cooling engine may be located within the engine ring, for example a regenerator 62.

The various other elements of the cooling engine, such as the cooler, compression space and piston would be located below the regenerator 62 and displacer 56 a is commonly known. For this reason, these elements are not shown. These elements may, however, be contained within a support ring 64 which serves to support the engine ring 60 and therefore the cold head 44, cooling plate 42 piston plate 30, support plate 12 and chips 14, and connector board 20.

To reduce the thermal transfer away from the elements shown in the drawings, the device 10 may include thermal insulating means surrounding the elements previously described and shown in the drawings.

This thermal insulating means may include a support hub 66 connected to and surrounding the lower end of engine ring 60. Support hub 66 and engine ring 60 may be connected as by mating flanges. Support hub 66 is preferably formed of stainless steel to provide the required strength and thermal resistance.

Support hub 66 extends outwardly from engine ring 64 to provide a surface for the support of an insulating mass 68 which surrounds the engine ring 60, cold head 44, cooling plate 42, and piston plate 30. The insulating mass 68 may take many forms, including fibrous self-supporting materials such as fiber glass or powderous materials such as pearlite. Where the insulating mass 68 is formed of a powderous material, a supporting peripheral wall, as of plastic, must be provided at the desired outer periphery of the insulating mass 68.

The insulating mass 68 preferably does not extend above the piston plate 30 to allow easy access to the support plate 12 and chips 14. To reduce the thermal transfer from the components extending out of the insulating mass 68 it is advantageous to provide an insulating cover means over these components and the insulating mass 68.

Such an insulating cover may advantageously take the form of a double walled hood 70. To be sufficiently rugged, yet provide excellent thermal insulation at low cost, the hood 70 may be formed of an outer hood shell 72 and inner hood shell 74 formed of stainless steel. Inner hood shell 74 is of a smaller peripheral configuration to define an interior space 76 between these two elements. The interior space 76 may include further insulating means such as multiple layers (for example, 20) of aluminized Mylar ® insulation. The peripheral configuration of the hood 70 may, of course, correspond roughly to the peripheral configuration of the insulating mass 68 which will in turn correspond roughly to the peripheral configuration of the piston plate 30 and cold head 44.

The hood shells 72 and 74 and Mylar ® insulation 78 may be fixed to, and supported by, a hood ring 80. For improved thermal resistance the connection between the hood shells 72 and 74 and hood ring 80 may be a hermetic seal, with the space between the hood shells evacuated to reduce thermal transfer.

The hood ring 80 ma be supported upon a peripheral flange of the support hub 66. The thermal resistance of the device 10 may be improved by providing the support hub 66 or hood ring 80 with a peripheral groove 82 containing a peripheral O-ring seal 84 which makes contact with the support hub 66 and hood ring 80.

An advantageous alternative to this arrangement is to provide an intermediate ring 86 between the connection of the support hub 66 and hood ring 80. The intermediate ring 86 will be placed over the ribbon cable 26 exiting the device 10. Hood ring 80 will then be supported by the intermediate ring 86. As described above, intermediate ring 86 may include an intermediate groove 88 containing an intermediate O-ring seal 90 contacting the intermediate ring 86 and hood ring 80. Use of the support hub 66, hood 70, peripheral seal 84 and possibly intermediate seal 90 defines a closed cavity within device 10 to house the heat sink elements and electric components to improve the efficiency of the device. The hood ring 80 may be connected to the support hub 66 (with the intermediate ring interposed therebetween, it used) by appropriate screws or bolts.

The thermal efficiency of device 10 may be yet further improved by subjecting the closed cavity defined by hood 70 to a vacuum, or reduced pressure. In such an instance the hood 70 may include an appropriate coupling to a compatible vacuum device. Subjecting the closed cavity defined by hood 70 to a vacuum or reduced pressure will also eliminate the problem of condensation on the cooled elements. Condensation may also be reduced by placing an adsorbent material on the surfaces of one or more of the connector board 20, interior of hood 70, piston plate 30, cooling plate 42 or cold head 44. Placing a gas other than air within the cavity defined by hood 70 may also reduce condensation.

The use of intermediate ring 86 may also improve the thermal efficiency of the device in that the hood 70 may be removed without disturbing the connection between peripheral seal 84 and ribbon cable 26. As such, peripheral seal 84 need not reconform to the shape of ribbon cable 26 each time the hood is removed.

As is apparent from the above description, the present device provides an apparatus for subjecting integrated circuits to cryogenic temperatures which is both economical and convenient. The formation of the cold head 44 as a portion of the cooling engine reduces the amount of elements required for the heat sink for the chips 14. No coolant ducts, coolant or pumps are required, yet the chips are cooled to cryogenic temperatures to improve operating efficiency. Additionally, the hood 70 may be removed easily for inspection, repair or replacement of the electrical components.

While the present invention has been described above with reference to a specific embodiment, it should be realized that various modifications may be made. For example, various materials other than those listed above may be employed. Additionally, the geometric configuration of the elements may take any desired form. In particular, while certain elements have been described as "rings", such elements need not be circular.

From the foregoing it will be seen that this invention is one well adapted to attain all ends and objects hereinabove set forth together with the other advantages which are obvious and which are inherent in the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

What is claimed is:

1. A cryogenic cooling mount for integrated circuits, comprising:
    a chip support plate for supporting at least one integrated circuit chip;
    means for allowing electrical communication with the chip;
    a piston plate supporting said support plate, said piston plate being formed of a material allowing thermal conductivity through said piston plate;
    a cold head supporting, and in thermal communication with, said piston plate, said cold head being formed of a material allowing thermal conductivity through said cold head;
    cryogenic heat sink means in thermal communication with said cold head, at least a portion of said cold head forming operative structure of said heat sink means; and
    thermally insulating hood means surrounding said support plate, said piston plate and said cold head, said head means being coupled to said cold head.

2. A mount as in claim 1, wherein said hood means includes a hood comprising spaced outer and inner hood shells defining an interior space therebetween, and said hood further comprising a thermally insulating material within said interior space.

3. A mount as in claim 2, further comprising:
    a thermally insulating mass surrounding the periphery of said cold head and said piston plate, said mass being interposed between said hood means and said cold head and piston plate.

4. A mount as in claim 2, wherein said hood means further includes a support hub coupled to, and extending outwardly from, said cold head, said support hub supporting said hood.

5. A mount as in claim 4, wherein said hood means further includes a seal between said support hub and said hood.

6. A mount as in claim 5, including an integrated circuit chip supported on said chip support plate and wherein said means allowing electrical communication includes electrically conductive cable means operatively connected to said chip and extending to the exterior of said hood, and wherein said hood means further includes an intermediate ring and an intermediate seal, said support hub supporting said intermediate ring with said seal and said cable means interposed between said support hub and intermediate ring, and wherein said intermediate ring supports said hood with said intermediate seal interposed between said intermediate ring and said hood.

7. A mount as in claim 1, wherein said piston plate is biased into contact with said cold head.

8. A mount as in claim 7, further comprising:
a cooling plate interposed between, and in thermal communication with, said cold head and said piston plate, said cooling plate being formed of a material allowing thermal conductivity through said cooling plate.

9. A mount as in claim 8, further comprising:
a shim of relatively soft material allowing thermal conductivity interposed between, and in thermal communication with, said cold head and said cooling plate.

10. A cryogenic cooling mount for integrated circuits, comprising:
a chip support plate supporting an integrated circuit chip;
means for allowing electrical communication with said chip;
a piston plate supporting said support plate, said piston plate being formed of a material allowing thermal conductivity through said piston plate, said piston plate including a cavity extending therein associated with said chip, said cavity being located within said piston plate to substantially correspond to, and communicate with, the position of said chip when said piston plate supports said support plate;
a piston located in each said cavity, said piston being formed of a material allowing thermal conductivity through said piston;
means biasing said piston into physical contact, and therefore thermal communication, with said chip;
a cold head supporting, and in thermal communication with, said piston plate, said cold head being formed of a material allowing thermal conductivity through said cold head;
cryogenic heat sink means in thermal communication with said cold head; and
thermally insulating hood means surrounding said support plate, said piston plate and said cold head, said hood means being coupled to said cold head.

11. A mount as in claim 10, wherein said hood means includes a hood comprising spaced outer and inner hood shells defining an interior space therebetween, and said hood further comprising a thermally insulating material within said interior space.

12. A mount as in claim 11, further comprising:
a thermally insulating mass surrounding the periphery of said cold head and said piston plate, said mass being interposed between said hood means and said cold head and piston plate.

13. A mount as in claim 12, wherein said insulating mass is self-supporting.

14. A mount as in claim 13, wherein said hood means further includes a support hub coupled to, and extending outwardly from, said cold head, said support hub supporting said hood.

15. A mount as in claim 14, wherein said hood means further includes a seal between said support hub and said hood.

16. A mount as in claim 15, wherein said means allowing electrical communication includes electrically conductive cable means operatively connected to said chip and extending to the exterior of said hood, and wherein said hood means further includes an intermediate ring and an intermediate seal, said support hub supporting said intermediate ring with said seal and said cable means interposed between said support hub and intermediate ring, and wherein said intermediate ring supports said hood with said intermediate seal interposed between said intermediate ring and said hood.

17. A mount as in claim 10, wherein said piston plate is biased into contact with said cold head.

18. A mount as in claim 17, further comprising:
a cooling plate interposed between, and in thermal communication with, said cold head and said piston plate, said cooling plate being formed of a material allowing thermal conductivity through said cooling plate.

19. A mount as in claim 18, further comprising:
a shim of relatively soft material allowing thermal conductivity interposed between, and in thermal communication with, said cold head and said cooling plate.

20. A mount as in claim 10, further comprising an adsorbent material coupled to an interior surface of said hood means, or a surface of said piston plate or said cold head.

* * * * *